United States Patent [19]

Reichart

[11] Patent Number: 4,581,602

[45] Date of Patent: Apr. 8, 1986

[54] WIDE DYNAMIC RANGE ANALOG TO DIGITAL CONVERTER FOR AC SIGNALS

[75] Inventor: Elwood C. Reichart, Chicago, Ill.

[73] Assignee: Motorola, Inc., Schaumburg, Ill.

[21] Appl. No.: 685,274

[22] Filed: Dec. 24, 1984

[51] Int. Cl.$^4$ ............................................. H03K 13/02
[52] U.S. Cl. ............................................. 340/347 AD
[58] Field of Search ..... 340/347 AD, 347 M, 347 CC

[56] References Cited

U.S. PATENT DOCUMENTS

| | | | |
|---|---|---|---|
| 3,533,098 | 10/1970 | Munoz | 340/347 AD |
| 3,550,115 | 12/1970 | Picou et al. | 340/347 AD |
| 3,742,489 | 6/1973 | Lefevre et al. | 340/347 AD |
| 4,006,454 | 2/1977 | Beseke et al. | 340/146.1 R |
| 4,106,010 | 8/1978 | Houlett | 340/347 AD |
| 4,142,185 | 2/1979 | Gordon | 340/347 AD |
| 4,160,244 | 7/1979 | Solomon et al. | 340/347 AD |
| 4,232,302 | 11/1980 | Jagatich | 340/347 AD |
| 4,243,975 | 1/1981 | Masuda et al. | 340/347 NJ |
| 4,314,235 | 2/1982 | Ruf et al. | 340/347 AD |
| 4,329,679 | 5/1982 | Jensen | 340/347 AD |
| 4,338,589 | 7/1982 | Engel et al. | 340/347 CC |
| 4,350,974 | 9/1982 | Gordon et al. | 340/347 AD |

Primary Examiner—Vit W. Miska
Attorney, Agent, or Firm—Rolland R. Hackbart; Raymond A. Jenski

[57] ABSTRACT

A circuit for logarithmic analog to digital conversion is disclosed. An alternating current (AC) input signal of unknown level is logarithmically amplified, detected, and compared to an AC reference signal having a variable level and similarly amplified and detected. The comparison indicates which signal has a higher level and the level of the AC reference signal is responsively increased or decreased by an attenuation network having a plurality of related attenuation steps. When the signals are essentially equal, a digital representation is generated from the attenuation steps employed in attenuating the AC reference signal.

14 Claims, 6 Drawing Figures

WIDE DYNAMIC RANGE ANALOG TO DIGITAL CONVERTER FOR AC SIGNALS

BACKGROUND OF THE INVENTION

This invention relates to analog to digital conversion and more particularly to a logarithmic analog to digital conversion circuit in which an input alternating current (AC) signal to be converted to a digital signal is sequentially compared to a locally generated reference signal. When the attenuated reference signal equals the input signal, the amount of attenuation is used to generate a digital representation of the input analog signal.

Analog to digital (A/D) converters are well known and generally apply successive approximation or time constant measurement techniques to direct current (DC) signals to create a digital representation of the input analog signal. This representation is typically a binary word having a number of bits corresponding to the deired accuracy of the digital conversion.

If the input signal has a large range of signal strength (large dynamic range), the number of bits in the binary word must be correspondingly large. Furthermore, since the same number of bits are available to represent both the largest input signal strength and the smallest signal strength, the error represented by the difference of a least significant bit zero to a least significant bit one is proportionally smaller for the largest input signal strength than for the smallest input signal strength. To remedy this error, logarithmic analog to digital converters have been used.

Logarithmic A/D converters enable analog signals having signal strengths varying over many orders of magnitude to be converted to digital words. The least significant bit error, then, becomes a specified percentage of the input signal. Logarithmic A/D converters, however, may have absolute errors in magnitude which are caused by amplifier and detector drift with temperature and time. This problem becomes more acute when the input signal is not direct current but an alternating current of reasonably high frequency.

Therefore, one object of the present invention is to provide an analog to digital converter which converts a wide dynamic range alternating current into a digital format.

It is another object of the present invention to provide the means for compensating the analog to digital converter for the effects of temperature and time.

It is a further object of the present invention to rapidly converge on the digital representation of the analog alternating current signal.

SUMMARY OF THE INVENTION

These and other objects are achieved in the present invention of an analog to digital converter for converting a wide dynamic range alternating current (AC) input signal to a digital representation of the input signal. An AC reference signal is generated and attenuated by an attenuator employing combinations of attenuation elements with related attenuation values to obtain different values of attenuation. A logarithmic amplifier and detector converts the input and reference AC signals into direct current (DC) levels which are tested to determine if the attenuated reference signal DC level is greater than or less than the input signal DC level. The attenuation element combination is then responsively adjusted such that the composite value of attenuation becomes greater if the reference signal DC level is greater than the input signal DC level or becomes less if the reference signal DC level is less than the input signal DC level. The adjustment is stopped when the reference signal DC level and the input signal DC level are essentially equal. Since each attenuation element corresponds to a predetermined bit position in the digital representation, the digital representation of the analog signal may be determined from the combination of attenuation elements which are used to form the composite attenuation value.

DETAILED DESCRIPTION OF THE PREFERRED EMBODIMENT

Figure 1:
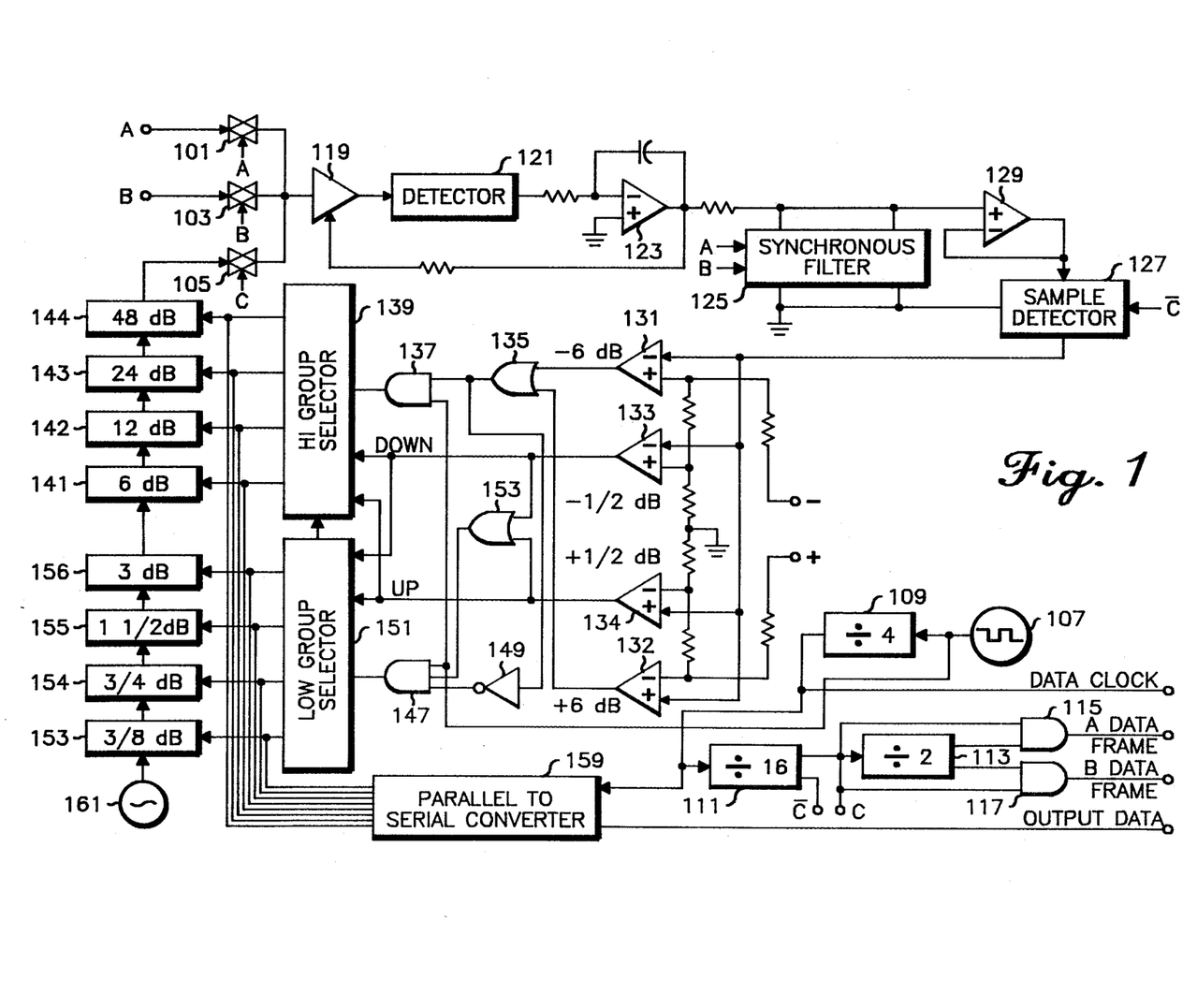
FIG. 1 is a block diagram of an analog to digital converter employing the present invention.

A block diagram of an analog to digital (A/D) converter including the present invention is shown in FIG. 1. One or more alternating current signals, which may be in a frequency range useable in a radio receiver intermediate frequency stage operating at a frequency such as 10.7 MHz, may be input to the A/D converter via an electronic switch. In FIG. 1 two input signals of unknown signal level may be sequentially converted into digital representation. These two signals, which may be labelled A and B, are input via transmission gate 101 and transmission gate 103, respectively. A third signal of the same frequency as A or B is input via transmission gate 105. These transmission gates may be part of a commercially available integrated circuit such as an MC14051, available from Motorola, Inc. and contain several individual transmission gates. Although two signals are shown and discussed, it will be realized by those skilled in the art that any number of unknown level input signals may be converted by the present invention.

Figure 2:
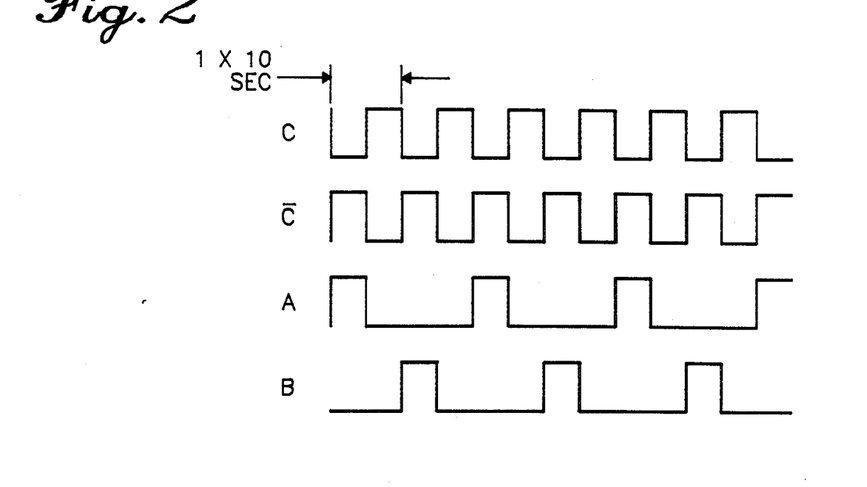
FIG. 2 is a timing diagram of the four clock signals employed in the present invention.

The transmission gates 101, 103 and 105 may be toggled by clock signals developed from clock oscillator 107. The clock oscillator 107, which may operate at 64 KHz, may be divided by a divisor of 64 to develop a toggling clock, C, operating at 1 KHz. In the preferred embodiment, this division of 64 is accomplished by two integrated circuits, a divide by 4 109 (an MC14024 manufactured by Motorola, Inc.) and a divide by 16 shown as 111 (an MC14024). The C clock is further divided by divide by 2 circuit 113 (an MC14024) which has outputs 180° out of phase from each other. Each output is combined by AND functions 115 and 117 with the C clock to yield the A clock and B clock respectively. Thus, three clock signals A, B, and C, are created having the relationships as shown in FIG. 2. Each positive going clock pulse has a pulse width of ½ millisecond. Clock pulses A and B have a negative going pulse width of 1½ milliseconds. Clock pulses A, B, and C are so arranged that only one of the clock signals is positive at a given time and a positive going C pulse is placed between each A and B pulse. A $\overline{C}$ pulse, which is 180° out of phase from the C pulse is also generated by the divide by 16 circuit 111.

The effect of applying the previously described clock signals to the transmission gates 101, 103, and 105 is to apply first the A input signal then a reference input signal, a B input signal, then a reference signal then an A input signal, etc., to the input of logarithmic amplifier 119. This logarithmic amplifier 119 will be described in detail later. After amplification, each sequential amplified signal is applied to a detector 121 where it is converted to a DC level and amplified by DC amplifier 123. Following amplification each sequential signal is applied to a synchronous filter 125 which individually filters the detected A input signal and B input signal. The detected A input signal and the detected B input signal are then synchronously compared to the reference signal in sample detector 127 following impedance inverting amplifier 129. Operation of the sample detector 127 will be described later.

The output from sample detector 127 is a DC signal having polarity and magnitude proportional to the difference between the detected reference signal and the detected A input signal or the detected B signal. For simplicity of analysis only the difference between the detected A signal and the reference signal will be considered here. It should be realized that the same process will hold for the detected B input signal since the process is synchronous. The DC difference signal is applied to 4 comparators, 131, 132, 133, and 134. These comparators may be conventional integrated circuits such as an MLM339 available from Motorola, Inc. Two of the comparators, 131 and 133 are connected to a negative DC reference and two of the comparators, 132 and 134, are connected to a positive DC reference. When the DC difference signal from sample detector 127 is negative, comparators 131 and 133 may operate; when the DC difference signal is positive, comparators 132 and 134 may operate. Thus, the polarity of the DC difference signal is determined and from this difference it is established that the reference signal is greater or smaller than the A input signal The magnitude of the difference may be determined by either the negative polarity DC difference signal comparators, 131 and 133, or the positive DC difference signal comparators, 132 and 134. The negative DC reference potential is resistively divided and applied to the positive input port of comparators 131 and 133. In the preferred embodiment, the DC reference potential applied to the positive input of comparator 131 equals 300 millivolts. The DC reference potential applied to the positive input port of comparator 133 is equal to 25 millivolts. Similarly, the DC reference potentials applied to comparators 132 and 134 are −300 millivolts and −25 millivolts respectively. These levels have been determined, in the preferred embodiment, to be proportional to differences of the input signal and the reference signal of 6 db and ½ db. Therefore comparators 131 or 132 provide an output when the absolute value of the DC difference signal indicates a signal level difference between the reference signal and the A input signal exceeds 6 db. Likewise, comparator 133 or 134 provides an output when the absolute value of the difference between the reference input signal and the A input signal is greater than ½ db.

Five possible relationships between the input reference signal and the A input signal are possible in this system. These possibilities are: the magnitude difference between the input reference signal and the A input signal is less than ½ db, the A input signal is greater than the reference input signal by more than ½ db but less than 6 db, the A input signal is greater than the reference input signal by 6 db or more, the reference signal is greater than the A input signal by more than ½ db but less than 6 db, or the reference input signal is greater than the A input signal by more than 6 db.

If the difference between the A input signal and the reference input signal is less than ½ db, the system is considered in balance and no further adjustment activity occurs during this clock cycle.

If the A input signal is greater than the reference signal by more than 6 db, a negative DC difference signal is output from sample detector 127 which enables a positive output signal from the −6 db comparator 131 and the −½ db comparator 133. The output from −6 db comparator 131 via OR gate function 135 is ANDed with the 64 KHz clock from oscillator 107 in AND function 137 which activates high group attenuation selector 139. The high group selector 139 may be a binary up/down counter commercially available as an MC14516B from Motorola, Inc. (Another alternative embodiment of the selector 139 may be a successive approximation register such as an MC14549 available from Motorola, Inc.). The high group selector 139 is connected via its four output ports to four serially connected attenuators 141, 142, 143, and 144, which have attenuation values related to each other by geometric progression. In the preferred embodiment these values are 6 db, 12 db, 24 db, and 48 db respectively. The direction in which the high group selector 139 counts (and selects an attenuation value) is determined by the up/down inputs driven by comparators 133 and 134. When the A input signal is greater than the reference input signal, the −½ db comparator 133 provides a positive output to the down input of high group selector 139. This results in the current attenuation value being removed and the next smaller geometrically related attenuation value being added to the attenuation of the reference signal. This process continues until the difference between the A input signal and the reference signal is less than 6 db.

Assuming that the A input signal is still greater than the reference input signal by an amount greater than ½ db but less than 6 db the DC difference signal is less than the DC potential reference at the input of −6 db comparator 131. This causes the output of comparator 131 to go low and the output of OR function 135 to go low, thereby providing a positive input to AND function 147 via inverter 149. The AND function 137, with a low on one of its inputs, disables high group selector 139. The −½ db comparator 133, however, retains a high output which is coupled to the down input of low group selector 151. The high output of comparator 133 is also coupled to OR function 153, which may be a diode network, and then to AND function 147. A third positive input from clock 107 causes AND function 147 to activate low group selector 151. Low group selector 151 may be a binary up/down counter such as an MC14516B manufactured by Motorola, Inc. The four outputs from low group selector 151 may be connected to attenuation blocks 153, 154, 155, and 156. These attenuation blocks are also related by geometric progression to each other and to the high group attenuation blocks 141 through 144, and in the preferred embodiment, have attenuation values of ⅜ db, ¾ db, 1½ db, and 3 db, respectively. Thus, with high inputs on the down port and the enable port of low group selector 151, the amount of attenuation presented to the reference signal is sequentially decreased until the difference between the attenuated reference input signal and the A input signal is less than ½ db. At this point, the output of comparator 133 goes low thereby disabling the low group selector 151 via OR function 153 and AND function 147. (AND functions 147 and 137 may be internally integrated in selectors 151 and 139 respectively).

A similar process occurs when the reference input signal is greater than the A input signal. Here, the +6 db comparator 132 and the +½ db comparator 134 may be activated when the reference input signal is greater than the A input signal by 6 db or more. The high group selector 139 is enabled during the clock time by +6 db comparator 132 via OR function 135 and AND functio high group selector 139 is enabled during the clock time by +6 db comparator 132 via OR function 135 and AND function 137. The low group selector 151 is disabled via invertor 149 and AND function 147. Direction of attenuator increments is chosen by +½ db comparator 134 which is coupled to the up inputs of selectors 139 and 151. Thus, the high group selector responsively removes the current attenuation value and adds the next higher increment attenuation value to the composite attenuation presented to the reference signal generated by generator 161. This process continues until the difference between the reference input signal and the A input signal is less than 6 db.

When the difference is less than 6 db, the high group selector 139 is disabled by a logic low output from comparator 132 via OR function 135 and AND function 137. The same logic low provides an enabling logic high to one input to AND function 147 via inverter 149. The +½ db comparator 134 provides a logic high to a second input to AND function 147 via OR function 153. The logic high from the clock on the third input of AND function 147 causes the low group selector 151 to choose the next higher attenuation value from the composite formed by attenuation blocks 153, 154, 155, and 156.

It is, of course, possible to overshoot the proper attenuation value. In this condition, the attenuation value may first increase by selection by the high group selector 139 and then decrease by selection by the low group selector or vice versa. Regardless, the proper attenuation is converged upon quickly by the present invention. There is no need to reset the attenuation value to a starting value in order to obtain the proper attenuation value for each input signal In the preferred embodiment, the 8 available outputs from high group selector 139 and low group selector 151 are combined in parallel to serial convertor 159. These 8 outputs, however, may be left in parallel format such that an 8 bit word may be formed with the status of the 48 db attenuation block 144 forming the most significant bit of the 8 bit word and the status of the ⅜ db attenuation block 153 forming the least significant bit of the 8 bit word. The amount of attenuation required to the reference signal (generated by a reference signal generator 161) to equate the input attenuated reference signal to the A input signal thereby becomes the digital representation of the magnitude of the A input signal. The absolute level and linearity of the digital output is not dependent, therefore, upon the characteristics of the analog amplifier 119, the detector 121, and following circuitry. Changes in gain, linearity, or slope of the analog transfer function has no measureable effect on the digital output since the measurement is a comparative measurement dependent only on the relative attenuator block utilizations and the reference oscillator.

Figure 3:
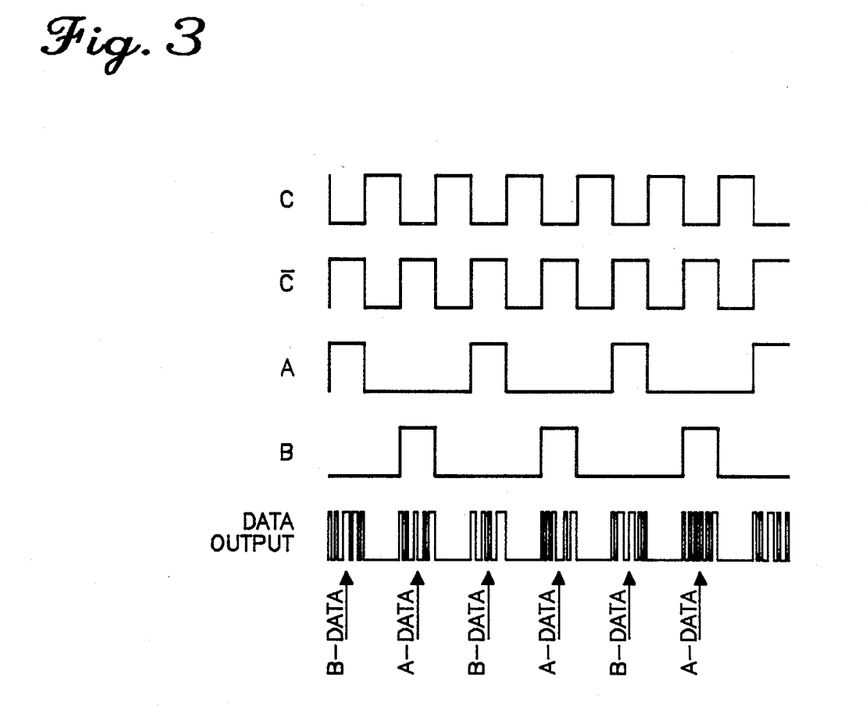
FIG. 3 is a timing diagram of the four clock signals of FIG. 2 which further includes the timing of the serial data output.

The output from parallel to serial convertor 159, which may be an MC74165 available from Motorola, Inc. or a shift register and AND gate arrangement which provides a read-out of a serial 8 bit word during the sample time of another input signal. FIG. 3 illustrates the timing of the data output. From this it can be seen that the 8 bit data word developed for the A input signal is transferred on the data output port during the B input signal sampling. And the B input signal data word is transferred during the A input sample period. (If more signals than A and B are sampled, the data output will be sequentially presented: the immediate past value presented during the attenuation of the present signal).

Figure 4:
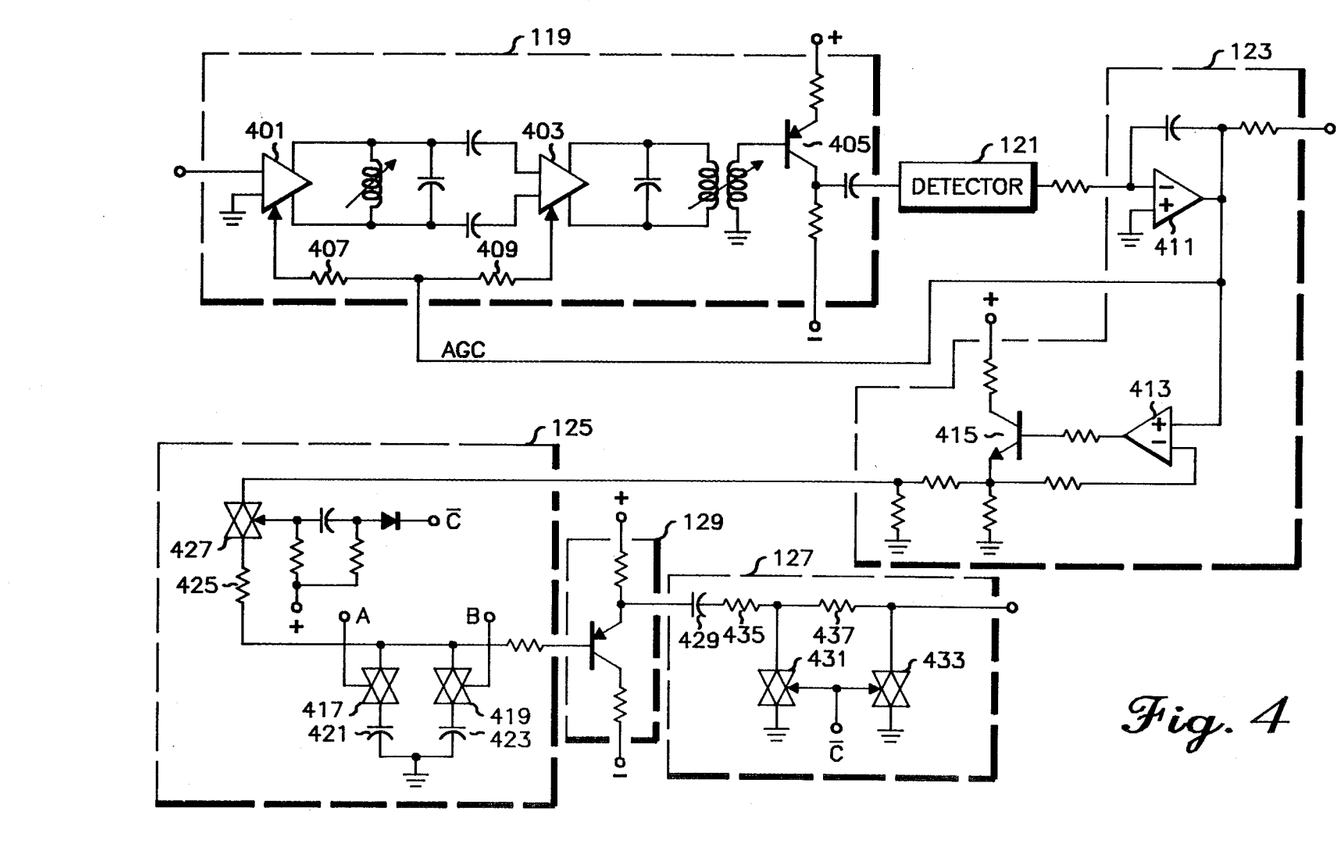
FIG. 4 is a block diagram of the logarithmic amplifier, detector, synchronous filter, sample detector, and DC amplifiers employed in the present invention.

Referring now to FIG. 4, the logarithmic amplifier 119, the detector 121, the DC amplifier 123, the synchronous filter 125, and the sample detector 127 can be explored in more detail. Considering the logarithmic amplifier 119 first, it can be seen that the basic logarithmic conversion is derived from the relationship between the AC input signal of a commercially available amplifier integrated circuit (an MC1350 in the preferred embodiment, available from Motorola, Inc.) and the gain control port on such an integrated circuit commonly referred to as the AGC input. One or more of these integrated circuits may be combined as shown in the combination of amplifier 401 and 403 of FIG. 4. Amplifier 401 serves as an input amplifier and is conventionally coupled to amplifier 403 which in turn is conventionally coupled to single-ended transistor amplifier 405 before being passed to detector 121. The feedback AGC (automatic gain control), which enables logarithmic amplification, is resistively split between the two amplifiers 401 and 403 by resistors 407 and 409. For each amplifier, a logarithmic function is closely followed over a 40 to 50 db range and by combining two or more amplifiers a wide total dynamic range can be achieved.

The sharing of the logarithmic amplification for multiple signals through a common amplifier or amplifiers enables small discrepancies in logarithmic tracking to be cancelled, thereby providing a high relative accuracy. Thus, this invention continuously and automatically compensates for the discrepancies in the amplifiers. (It is common that the absolute value of AGC control signal and corresponding amplifier gain reduction will vary widely from amplifier to amplifier and over the temperature range). This compensation is accomplished by taking a part of the AC signal output at the end of the amplifier chain and returning it as one of the input signals to the amplifier. The input AC signal is rectified by detector 121, which will be described later, and passed to DC amplifier 123. This amplifier may be one of many commonly known DC amplifiers and may have gain and impedance characteristics consistent with the design criteria of the other elements of the circuit. In the preferred embodiment, the DC amplifier consists of a two stage integrated amplifier such as an MC4558 manufactured by Motorola, Inc. (411, 413) and an NPN transistor 415 which, when combined with amplifier 413, provides a very low output impedance. (A similar low output impedance amplifier is described in U.S. Pat.

No. 4,268,798, "High Performance Summing Amplifier" assigned to the assignee of the present application). The output of the DC amplifier 123 is to a commutating filter 125.

The commutating filter 125 is employed to improve the system response time and signal to noise by providing independent time constants for each of the unknown input signals. In the preferred embodiment, where there are two unknown signals A and B, two transmission gates 417 and 419 (which may be part of an MC14051, manufactured by Motorola, Inc.) are coupled to capacitors 421 and 423 between the DC signal path and ground. Working against resistor 425 and the output impedance of DC amplifier 123, switched capacitor 421 forms an integrator for the rectified A input signal during the time that clock signal A is high. Likewise, capacitor 423 and resistor 425 and output impedance of DC amplifier 123 form an integrator for the rectified B input signal during the time period when clock signal B is high. Thus, the commutating filter provides a serial output which is time multiplexed between the input signals and, in the preferred embodiment, provides a linear voltage of 1.3 to 11.6 volts covering approximately 100 db input signal range. A transmission gate 427 delays the application of the detected AC input signal to the commutating filter for a brief period of time after the $\overline{C}$ signal goes high. This prevents erroneous signals generated by the input commutating switch from improperly disturbing the commutating filter.

The output of the commutating filter 125 is passed through DC amplifier 129, through transfer capacitor 429, and the remainder of the sample detector 127. The sample detector basically operates by comparing the charge established across transfer capacitor 429 by detected and filtered A input signal (which is detected and filtered during the A clock time) to the reference input signal (which is detected during the C clock time). Operation of the sample detector 127 can best be understood by an example. Assume that the charge across transfer capacitor 429 is equivalent to 10 volts during the A clock time (established by the detected and filtered A input signal). The $\overline{C}$ clock signal goes high simultaneously with the A clock signal and therefore grounds one end of transfer capacitor 429 through transmission gates 431 anu 433 via resistors 435 and 437. (These transmission gates may be part of MC14051 manufactured by Motorola, Inc.). At the end of the A clock signal the transmission gates 431 and 433 are opened thereby applying the previously grounded terminal of the transfer capacitor 429 to the following stage. At this time the detected reference signal is applied to transfer capacitor 429. If the detected DC value of the reference signal is assumed to be 9 volts, a negative 1 volt potential difference will appear at the output of the sample detector 127. Thus a voltage equal to the difference between the input reference signal and the A input signal will appear at the output of the sample detector 127. The polarity of this difference voltage will depend upon whether the reference input signal is greater than the A signal (yielding a positive polarity potential difference) or the input reference signal is less than the A input signal (yielding a negative polarity potential difference). An equivalent process occurs when the B input reference signal is compared to the input reference signal.

Figure 5:
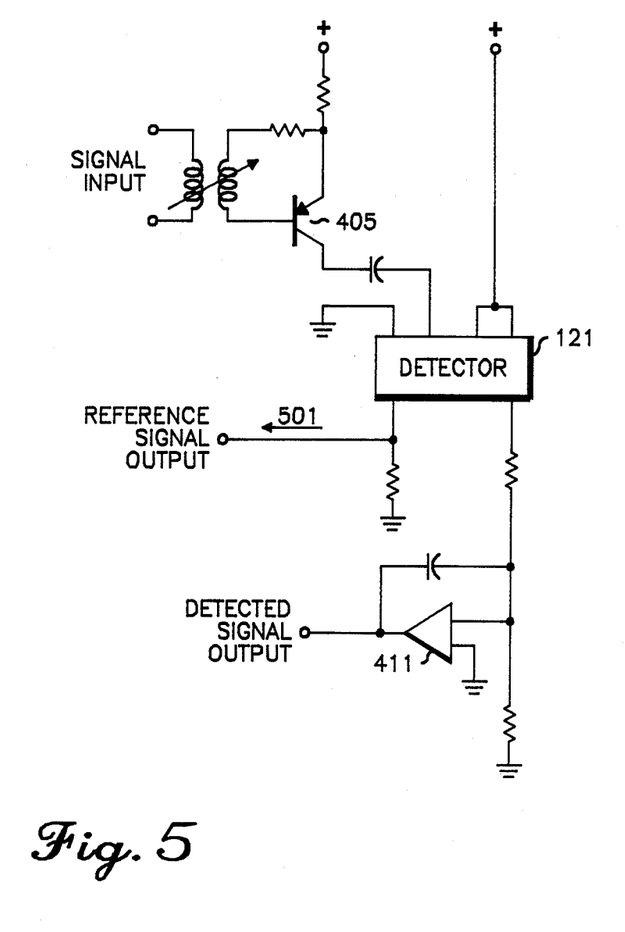
FIG. 5 is a block diagram of the detector showing generation of the reference signal employed in the present invention.

Details of the signal detector 121 are shown in FIG. 5. Detector 121 may be a commercially available integrated circuit such as an MC1330 available from Motorola, Inc. One of the outputs from detector 121 is an amplified and limited signal equivalent to the input signal. By maintaining the proper phase shift around the logarithmic amplifier and detection loop, the entire amplifier may be thus converted into a reference oscillator whose level can be set at the center of the dynamic range or at some particular level of interest. This signal, 501, can then be used as the reference input signal thereby avoiding the necessity of a separate oscillator such as oscillator 161 in FIG. 1.

Figure 6:
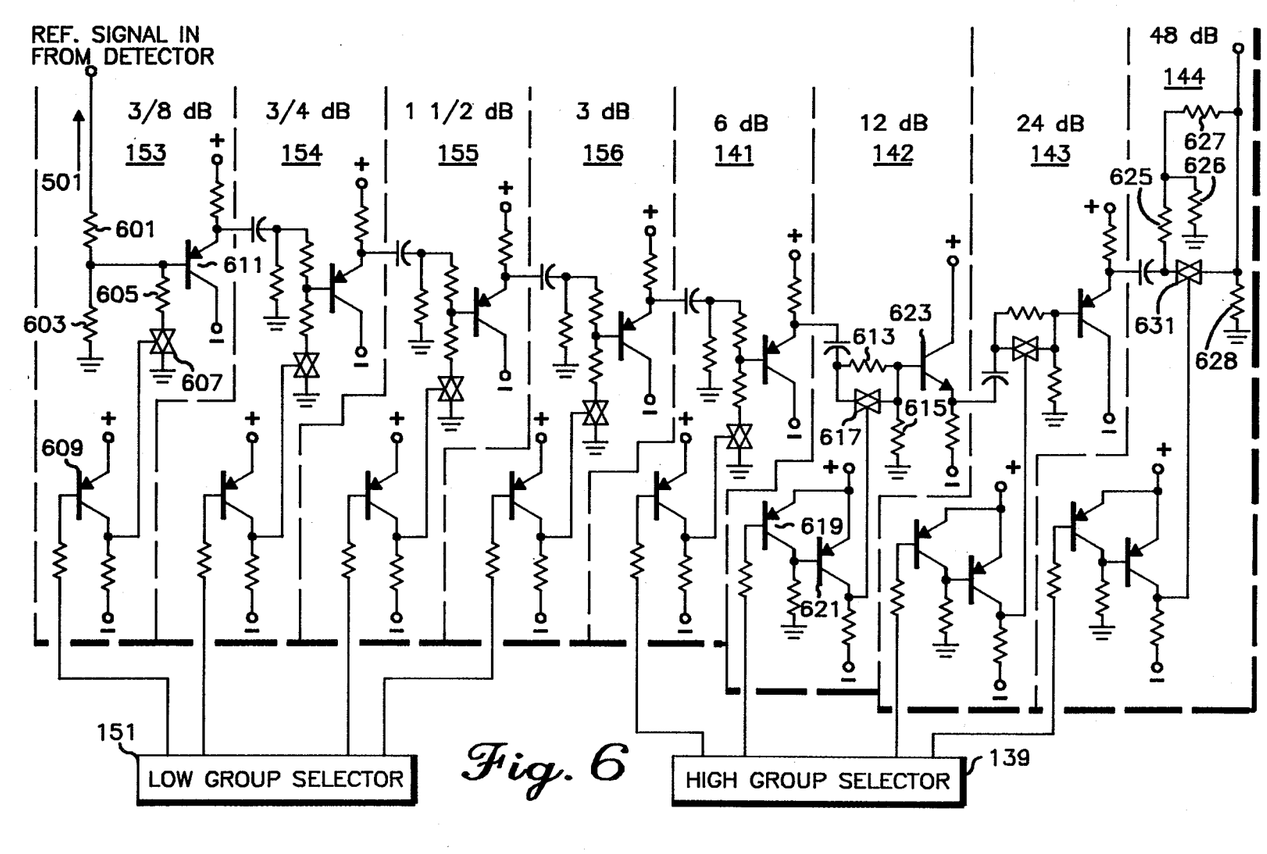
FIG. 6 is a schematic diagram of the attenuator elements employed in the present invention.

The attenuators followng the reference signal 501 generator are shown in FIG. 6. Attenuator elements 153, 154, 155, 156, and 141 essentially consist of a 3 resistor attenuation network with one of the shunt resistance values switched by a transmission gate and followed by a buffer transistor amplifier. Specifically, attenuation element 153 employs resistors 601, 603, and 605 in one possible attenuation configuration. Resistor 605 is switchably removed from the attenuation network by transmission gate 607 (which may be part of an MC14051 transmission gate integrated circuit available from Motorola, Inc.). The transmission gate 607 is driven by driver transistor 609 which in turn is driven from a predetermined output of the low group selector 151. A buffer transistor amplifier 611 protects the match of the attenuation network from changing termination impedances. The other attenuation elements 154, 155, 156, and 141 operate in a similar manner and are coupled to appropriate preselected selector outputs.

Attenuation elements 142 and 143 employ a two resistor L-network attenuator with the series resistance shunted by a transmission gate. Thus, in attenuation element 142, resistor 613 and 615 comprise an attenuation network. Resistor 613 is shunted by transmission gate 617 which, unlike the previously mentioned attenuating switching transmission gates (i.e., transmission gate 607), is switched in when the attenuator is not selected and requires an inversion transistor 619 in addition to a driver transistor 621. The attenuation network is followed again by a buffer transistor 623.

Attenuation element 143 operates in a fashion similar to that of attenuation element 142. Because of the higher value attenuation necessary for attenuation element 144, a two section L attenuator is used. This L attenuator, comprised of resistors 625, 626, 627, and 628, are bypassed by transmission gate 631 when the attenuation element 144 is not selected. Therefore, an inverting transistor and a driver transistor similar to that employed by attenuation elements 142 and 143 is employed in attenuation element 144. The output from attenuation element 144, which is the reference signal 501 attenuated by the series coupled attenuation elements selected by low group selector 151 and high group selector 139 in a manner described previously, is coupled to transmission gate 105 for sequential application to the logarithmic amplifiers and detectors.

The values for each attenuation element are related by geometric progression from the lowest to the highest attenuation value. In the preferred embodiment, the attenuations are as follows: attenuators 153, 154, 155, and 156 have attenuation values of $\frac{3}{8}$ dB, $\frac{3}{4}$ dB, 1$\frac{1}{2}$ dB, and 3 dB. The high group attenuation values are for attenuators 141, 142, 143, and 144: 6 dB, 12 dB, 24 dB, and 48 dB. Thus, the variable attenuators in the reference signal path covers 96 dB in $\frac{3}{8}$ dB steps.

In summary, an analog to digital converter as been shown and described in which a wide dynamic range alternating current input signal may be converted into a digital representation in a manner such that the absolute level and linearity of the digital output is not dependent upon the characteristics of the logarithmic amplifier or detector. This is accomplished by comparing an unknown input signal to an attenuated reference signal which is varied in amplitude until the unknown input signal and the reference signal are essentially equal. The amount of attenuation, which is variable in discrete steps related by geometric progression, is equivalent to the digital representation in that the use or nonuse of each attenuation step relates to the digital output with the largest attenuation step equivalent to the most significant bit in the digital representation and the smallest attenuation step equivalent to the least significant bit of the digital representation. Therefore, while a particular embodiment of the invention has been described and shown, it should be understood that the invention is not limited thereto since many modifications may be made by those skilled in the art. It is therefore contemplated to cover by the present application any and all such modifications that fall within the true spirit and scope of the basic underlying principles disclosed and claimed herein.

I claim:

1. Analog to digital converter circuitry for use in converting a wide range input alternating current (AC) signal to a digital representation comprising:
   means for generating a reference AC signal;
   means for modifying said reference AC signal level by a plurality of modification steps corresponding to predetermined bit positions of the digital representation;
   means for logarithmically amplifying the AC input signal and said modified reference AC signal and for rectifying the amplified AC signals into corresponding direct current (DC) levels;
   means for determining if the modified and rectified reference AC signal DC level is greater or less than the rectified input AC signal DC level and for causing said modifying means to adjust said reference AC signal level to a smaller or greater level, respectively; and
   means for determining which modification steps are employed in modifying said reference AC signal level and for creating the digital representation from said determination.

2. Analog to digital converter circuitry in accordance with claim 1 wherein said means for modifying said AC reference signal level is an attenuator which establishes a composite value of attenuation from a plurality of elements each having related attenuation values.

3. Analog to digital converter circuitry in accordance with claim 2 wherein said related attenuation values are related by geometric progression.

4. Analog to digital converter circuitry in accordance with claim 2 wherein said related attenuation values corresponding to a predetermined bit position have the element with the highest value of attenuation forming the most significant bit of the representation and the element with the lowest value of attenuation forming the least significant bit of the representation.

5. Analog to digital converter circuitry in accordance with claim 1 further comprising means for switching the input of said logarithmic amplifying means between the input AC signal and said reference AC signal.

6. Analog to digital converter circuitry in accordance with claim 5 further comprising means for filtering each said rectified AC signal in synchronism with said input switching means.

7. Analog to digital converter circuitry in accordance with claim 1 further comprising means for determining if the absolute value of said reference AC signal DC level exceeds the absolute value of the input AC signal DC level by a predetermined amount and for causing said modification means to adjust said reference AC signal level by selecting predetermined larger values of modification steps.

8. Analog to digital converter circuitry in accordance with claim 7 further comprising means for detecting when the modified reference AC signal DC level is essentially equal to the input AC signal DC level and ceasing to adjust said modification means in response to said detection.

9. Analog to digital converter circuitry in accordance with claim 1 wherein said means for generating an AC reference signal employs said means for logarithmically amplifying AC signals in an oscillator configuration.

10. A method for converting a wide range input alternating current (AC) signal to a digital representation comprising the steps of:
    generating an reference AC signal;
    modifying said reference AC signal by a plurality of modification values corresponding to predetermined bit positions in the digital representation;
    logarithmically amplifying the AC input signal and said modified reference AC signal and rectifying the amplified AC signals into direct current (DC) levels;
    determining if the modified and rectified reference AC signal DC level is greater or less than the rectified AC input signal DC level and causing said modifying step to adjust said reference AC signal level to a smaller or greater level, respectively; and
    determining which modification values are employed in modifying said reference AC signal and creating the digital representation from said determination step.

11. A method in accordance with the method of claim 10, further comprising the step of switching between the input AC signal and said reference AC signal before logarithmically amplifying each signal.

12. A method in accordance with the method of claim 11, further comprising the step of filtering each rectified AC signal in synchronism with said switching step.

13. A method in accordance with the method of claim 10, further comprising the step of determining if the absolute value of said reference AC signal DC level exceeds the absolute value of the input AC signal DC level by a predetermined amount and causing said modification step to adjust said reference AC signal level by selecting predetermined larger values of modification values.

14. A method in accordance with the method of claim 13, further comprising the step of detecting when the modified reference AC signal DC level is essentially equal to the input AC signal DC level and ceasing adjustment of said modification step in response to said detection.

* * * * *